United States Patent
van Waasen et al.

(10) Patent No.: US 8,260,218 B2
(45) Date of Patent: Sep. 4, 2012

(54) MIXER CIRCUIT AND RF TRANSMITTER USING SUCH MIXER CIRCUIT

(75) Inventors: Stefan van Waasen, Kolbermoor (DE); Anna-Maria Lann, Gustavsber (SE); Paul Stephansson, Bromma (SE); Fredrik Pusa, Sundbyberg (SE); Jan Dahlin, Jarfalla (SE)

(73) Assignee: Intel Mobile Communications GmbH, Neubiberg (DE)

( * ) Notice: Subject to any disclaimer, the term of this patent is extended or adjusted under 35 U.S.C. 154(b) by 679 days.

(21) Appl. No.: 12/143,613

(22) Filed: Jun. 20, 2008

(65) Prior Publication Data

US 2008/0254754 A1   Oct. 16, 2008

(30) Foreign Application Priority Data

Dec. 22, 2005   (WO) ................. PCT/SE2005/002017

(51) Int. Cl.
 *H04B 1/02*   (2006.01)
(52) U.S. Cl. .... 455/91; 455/313; 455/234.1; 455/182.3; 455/118; 327/359
(58) Field of Classification Search .................... 455/91, 455/313, 234.1, 182.3, 118; 327/359
See application file for complete search history.

(56) References Cited

U.S. PATENT DOCUMENTS

| | | | |
|---|---|---|---|
| 6,040,731 A * | 3/2000 | Chen et al. ..................... 327/359 |
| 6,807,406 B1 * | 10/2004 | Razavi et al. .................. 455/313 |
| 7,139,546 B1 * | 11/2006 | Petrov et al. .................. 455/323 |
| 7,263,344 B2 * | 8/2007 | Manku ........................... 455/323 |
| 7,816,990 B2 * | 10/2010 | Hijikata et al. ............... 330/279 |
| 2002/0050861 A1 * | 5/2002 | Nguyen et al. ................ 330/254 |
| 2003/0027531 A1 * | 2/2003 | Malhi et al. ..................... 455/73 |
| 2003/0129958 A1 | 7/2003 | Behzad |
| 2005/0282510 A1 | 12/2005 | Bang et al. |

FOREIGN PATENT DOCUMENTS

| EP | 1343248 | 9/2003 |
| EP | 1363392 | 11/2003 |

OTHER PUBLICATIONS

Ihm, "A Transmitter Front-End Design for 5GHz WLAN Applications", 4th International Conference on Microwave and Millimeter Wave Technology Proceedings, IEEE, Jul. 2004, pp. 582-585.

* cited by examiner

*Primary Examiner* — Sanh Phu
(74) *Attorney, Agent, or Firm* — Eschweiler & Associates, LLC

(57) ABSTRACT

Described herein are techniques for providing a mixer circuit having a mixer core. The mixer circuit includes a variable current block that is arranged to feed the mixer core with an amplified input signal.

14 Claims, 5 Drawing Sheets

MIXER CIRCUIT AND RF TRANSMITTER USING SUCH MIXER CIRCUIT

CROSS-REFERENCE TO RELATED APPLICATIONS

This application is a continuation under 35 U.S.C. §120 and §365(c), and incorporates by reference in its entirety, International Application No. PCT/SE2005/002017 filed Dec. 22, 2005, which designates the United States of America.

TECHNICAL FIELD

This disclosure generally relates to a mixer circuit suitable for radio frequency (RF) transmitters, and to a RF transmitter comprising such mixer circuit.

BACKGROUND

There is an ever-increasing growth of wireless communication and the development within this field entails making all kinds of portable devices as small as possible in order to render them more convenient to bring along anywhere. The development towards smaller and smaller portable devices is obviously accompanied by requirements for smaller building blocks or electronic components comprised within the devices, posing several challenges to the engineers designing the components. The progresses in making devices and circuits smaller bring about costly development work, and as the manufacturers compete in offering the users the smallest possible mobile equipment most worth its price, production costs of portable devices are a concern to them.

The more components that are required the higher the chip count and cost of implementing the circuit as well as increased complexity in wiring. Simplifying the wiring of a circuit often reduces the overall costs considerably, as does any reduction of the number of components. Further, eliminating components also decreases the power being dissipated by the circuit, requires less cooling and entails lessened power consumption.

Portable devices such as mobile phones require a multitude of electronic components, for example RF (Radio Frequency) modulators comprising, among other things, voltage controlled oscillators, mixers and power amplifiers. All these components naturally require current and each component also adds to the complexity and wiring and therefore cost of the mobile phone.

Examples of state of the art RF modulators are direct Voltage Controlled Oscillator (VCO) modulators and complex In-phase and Quadrature (I/Q) modulators. Direct VCO modulation is suitable only for Frequency Modulation (FM) and Frequency Shift Keying (FSK), while I/Q modulation is able to support any modulation scheme. I/Q modulation requires two mixers for receiving input signals I(t) and Q(t) carrying the information to be transmitted, and received from a previous step including base band signal processing. FIG. 1 shows a conventional modulator utilising I/Q modulation. The modulator 1 comprises a quadrature oscillator 3 and input signals I(t), Q(t) are mixed with carrier signals cos$(\omega_{LO}t)$,sin$(\omega_{LO}t)$ in mixers 2a, 2b. The resulting mixed I(t) and Q(t) signals are added by an adder 4 resulting in a signal g(t).

Further, the modulated signal g(t) of the I/Q modulator has to be amplified before being output to the antenna, which amplification is performed by power amplifiers (PA) 5. The power consumption of a portable device is often of great concern, and a power amplification stage of such device consumes a large part of the power source capacity. Reducing the power consumption in the power amplification stage can entail a profound impact on overall device battery life.

It would thus be desirable to be able to simplify the design of an RF modulator further yet, reducing its size and weight and lowering the power consumption.

SUMMARY

A mixer circuit is described, suitable for a RF transmitter, resulting in a smaller device and a more efficient current consumption, and having a reduced number of current requiring components.

In accordance with one implementation, a mixer circuit is provided for enabling a reduced current consumption. The mixer circuit comprises a mixer core for mixing an input frequency signal with a local oscillator signal. The mixer circuit further comprises a variable current block arranged to feed the mixer core with an amplified input signal, wherein the variable current block comprises transistors and switches enabling provision of a variable current. By means of the implementation, the current consumption of a modulator or transmitter utilising such mixer circuit can be reduced by varying the current required in accordance with power output need, that is, an appropriate current can be used when the mixer is not used in maximum output power mode. The mixer circuit also performs power amplification and no extra driver is needed at the output, and the resulting modulated signal can be output to an antenna without an intermediate power amplification stage. The current consumption can thereby be reduced considerably and the circuit requires less chip area. The use of digital programmable power gain can also reduce the current consumption, since unnecessarily large power can be avoided.

In accordance with another implementation, the mixer circuit further comprises a voltage to current conversion block comprising transistors for performing a voltage to current conversion. The voltage to current conversion block receives input Intermediate Frequency (IF) signals, converts a difference in IF voltage of the input signals to a difference in IF current and output to the variable current block the corresponding difference in IF current.

In accordance with another implementation, the voltage to current conversion block of the mixer circuit further comprises a variable resistor arranged between the transistors. Thereby a fine-tuning if said variable current can be provided. The fine-tuning can for example be performed in small 1 dB steps. In another embodiment the voltage to current conversion block comprises a fixed resistor arranged between the transistors. A flexible solution is thus provided giving the circuit designer different options in the design, tailored for a specific application.

In accordance with still another implementation, the mixer circuit further comprises biasing transistor blocks generating bias currents to the variable current block, to the mixer core and to the voltage to current conversion block. All different parts can be integrated onto a single integrated circuit, providing a small active mixer circuit, for use, for example in a cellular phone.

In accordance with yet another implementation, the current conversion block and the biasing transistor blocks on the one hand and the variable current block and the mixer core on the other hand, are arranged to be fed individually. A low voltage supply of a few volts, which is a usual range for portable devices such as cellular phones, is not enough for having both V/I conversion and mixer core sharing the same voltage supply. Therefore the mixer core and the variable current block are designed in a part separated from the V/I conversion, that is, to make use of a small power supply individually.

In accordance with still another implementation, the voltage to current conversion block and the mixer core are arranged with cascode devices. This provides increased output impedance without the need to add resistors.

DETAILED DESCRIPTION

Figure 1:
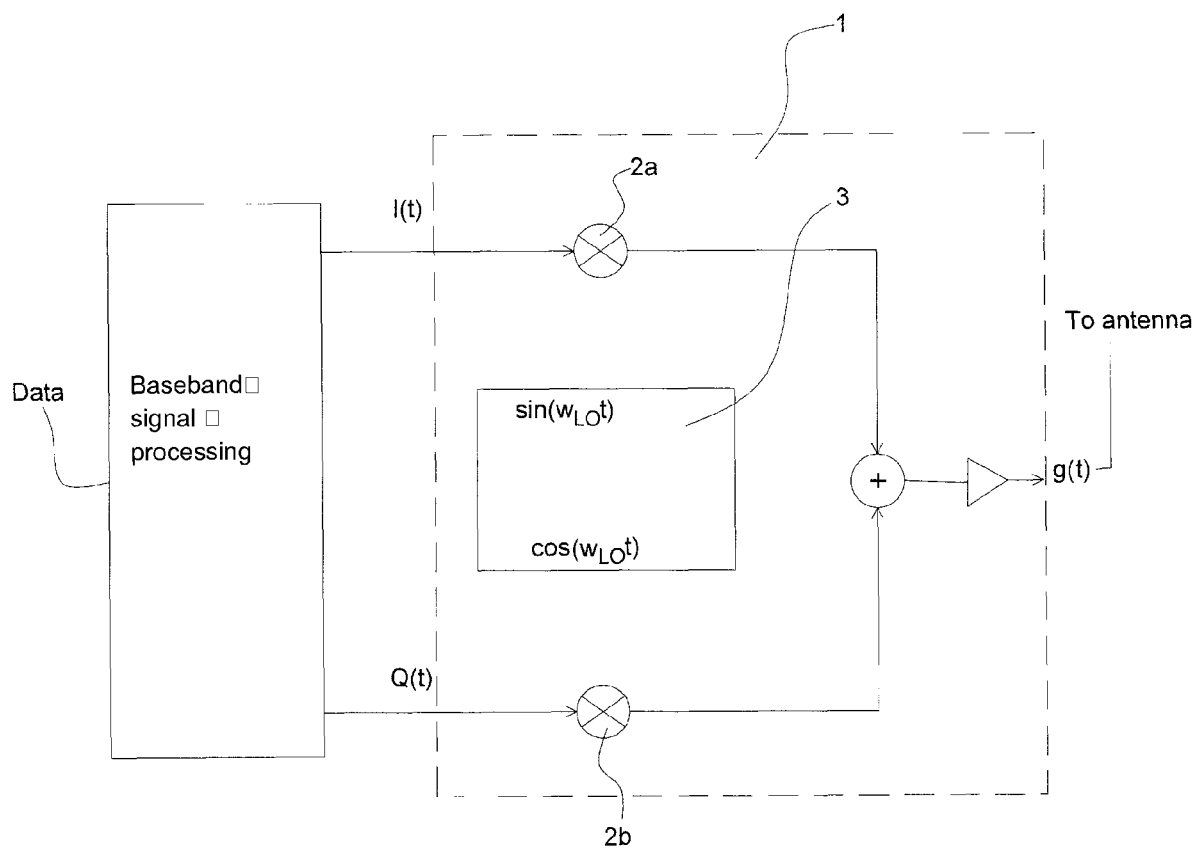
FIG. 1 illustrates a conventional in-phase and quadrature modulator.
Figure 2:
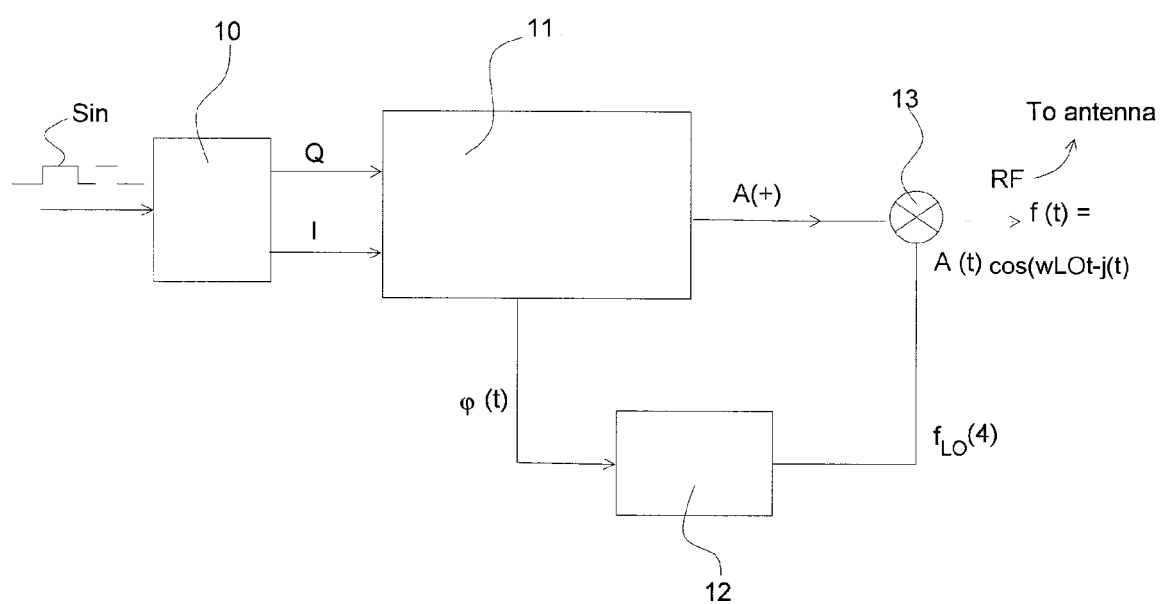
FIG. 2 is a transmitter block diagram of a transmitter.

One way to reduce the number of components required in a modulator circuit is to utilise polar modulation, which is a technique whereby a carrier signal, having a constant radian frequency $\omega_c$, is time-varied in both magnitude and phase. Stated differently, polar modulation is accomplished by varying the magnitude A of a carrier signal over time or the phase angle $\phi$ of a carrier over time or both. With reference now to FIG. 2, the use of polar modulation requires a single mixer 13, which thus is a reduction in the number of mixers compared to modulators utilising in-phase and quadrature phase modulation. A digital base band signal $S_{in}$ is modulated as Gaussian Frequency Shift Keying (GFSK), Quadrature Phase-shift Keying (QPSK) or differential phase-shift keying (8-DPSK) in block 10. The I(t) and Q(t) signals are then transformed to polar representation, the modulated data having amplitude A and phase $\phi$. Modulating the local oscillator signal, generated by means of a digital phase locked loop (DPLL) circuit 12, by the phase information makes it possible to carry out the RF modulation using a single mixer 13. One or more implementations described herein utilize the above-described polar modulation, and thus a single mixer.

As was mentioned in the introductory part, RF signal processing, for example amplification, consumes a great amount of current and it would be advantageous to be able to reduce the number of components without lowering the performance. The implementations described herein are concerned with the mixer stage 13, and provide an innovative architecture resulting in a reduced current consumption, a reduced chip area requirement and less complexity in wiring rendering the manufacturing of the circuit easier and thus less expensive.

There are various mixers available, single balanced, double and even triple balanced mixers, double and triple-balanced mixers providing better isolation from the local oscillator LO and spurious emissions compared to a single balanced. A popular double-balanced mixer used in RFIC (Radio Frequency Integrated circuit) designs is the Gilbert Cell mixer, both inputs to which are differential. Such a Gilbert mixer was somewhat fundamental to implementations described herein, and in order to facilitate the understanding, a brief description of a general Gilbert mixer is provided.

Figure 3:
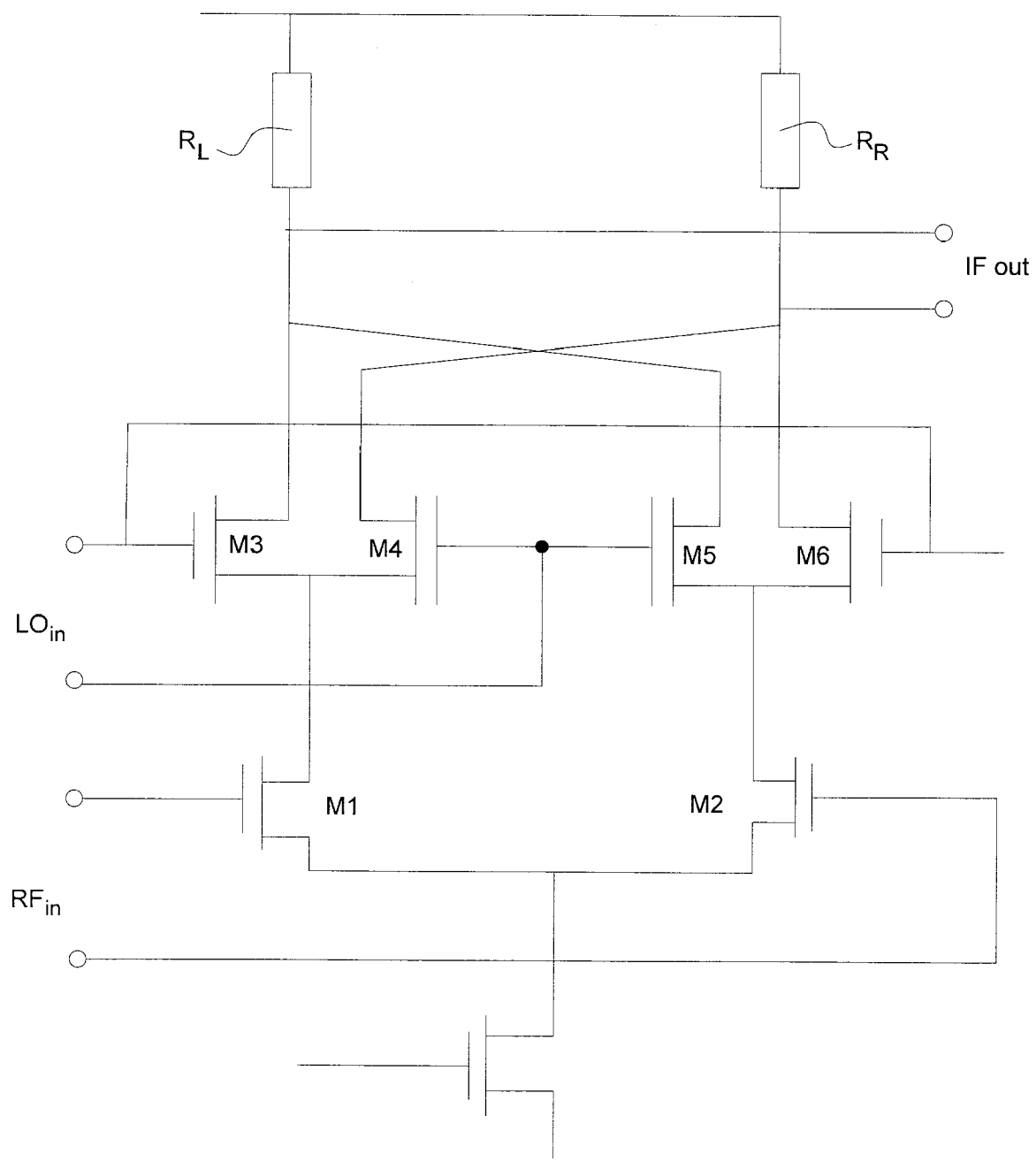
FIG. 3 illustrates a conventional standard Gilbert cell mixer.

FIG. 3 shows a standard Gilbert cell mixer circuit. An input RF signal is applied to transistors $M_1$ and $M_2$, which perform a voltage to current V/I conversion. The input signal A is converted to a differential current signal $\Delta i$ and added or subtracted from the bias current $I_b$. Transistors $M_3$, $M_4$, $M_5$, $M_6$ perform a multiplication function, multiplying the linear RF signal current from $M_1$ and $M_2$ with a local oscillator (LO) signal applied across transistors $M_3$, $M_4$, $M_5$, $M_6$. $M_1$ and $M_2$ provide +/−RF current ($I_b \pm \Delta i$) and transistors M3 and M6 switch between them to provide the RF-signal or the inverted RF signal to the left hand load $R_L$. $M_4$ and $M_6$ switch between them for the right hand load $R_R$. The two resistors $R_L$, $R_R$ form a current to voltage transformation giving differential output intermediate frequency (IF) signals. Transistors $M_1$ and $M_2$ thus provide the V/I conversion, and the transistors $M_3$, $M_4$, $M_5$ and $M_6$ constitute the mixer core of a conventional Gilbert mixer circuit.

Having described briefly a known Gilbert mixer circuit, an implementation will next be described thereby readily enabling a thorough understanding of the modifications made to the standard Gilbert mixer. When applicable, the same reference numerals will be used for the innovative mixer circuit as is used for the transistors of the known Gilbert mixer.

Figure 4:
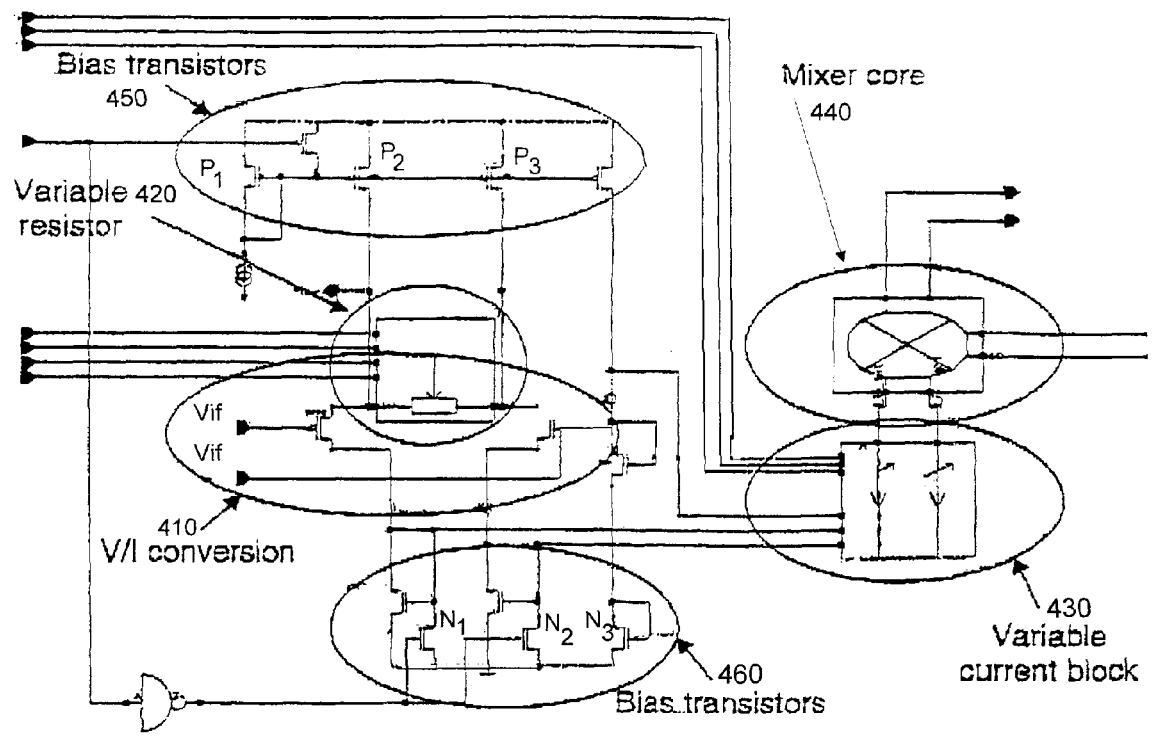
FIG. 4 is a detailed schematic for an implementation of a mixer circuit.

FIG. 4 shows a detailed schematic for a mixer circuit 400. Six different parts have been encircled 410, 420, 430, 440, 450 and 460, and will be described in the following.

The first encircled part 410 is the voltage to current V/I conversion part, comprising transistors $M_1$ and $M_2$. The IF signals, $V_{if+}$ and $V_{if-}$ are the input signals to this stage and the difference in IF voltage is converted to a difference in IF current, as is done in a known Gilbert cell mixer and as was explained above. In accordance with one implementation, the voltage to current converter is made to have a variable gain, and this is accomplished by including within the V/I conversion stage 410 a variable resistor $R_v$.

The second encircled part 420 shows such variable resistor $R_v$, implemented in order to enable an adjustable power gain. The variable resistor $R_v$ provides a power gain adjustable preferably in fine 1 dB steps, although other power steps are conceivable. Decreasing the value of the resistor $R_v$ increases the gain, and conversely, increasing the value of the resistor reduces the gain. By providing a variable resistor $R_v$ the conversion gain, i.e. the ratio (in dB) between the IF signal and the RF signal or input and output power level of current, of the mixer can be varied. In accordance with one implementation, no resistor is added, and in a still further embodiment, the resistor has a predetermined, fixed resistance suitable for the application in question. Further still, several resistors can be provided. The value of the one or more resistors can be chosen in order to optimise a certain desired performance parameter, such as noise performance or conversion gain.

Figure 5:
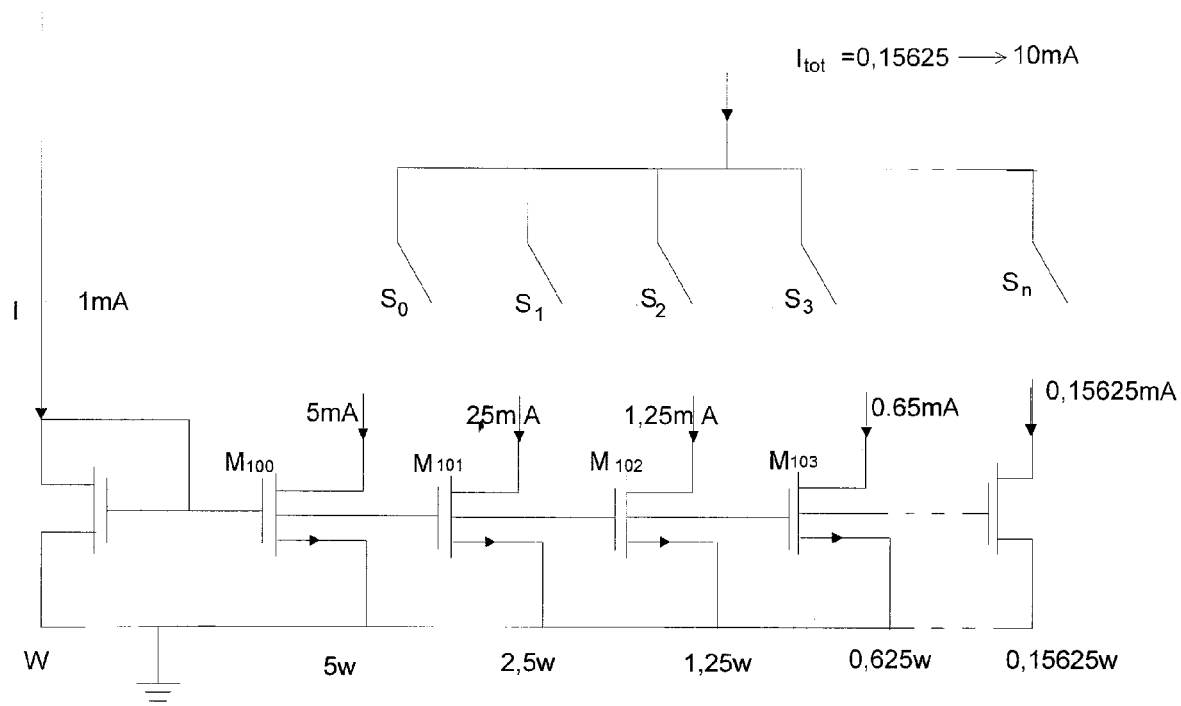
FIG. 5 illustrates an implementation of a variable current block within a mixer circuit.

The third encircled part 430 is a variable current block and is implemented in order to enable an adjustable power gain and described more in detail with reference to FIG. 5. The variable current block 430 provides a gain being adjustable in coarse 6 dB power steps. Depending on the digital gain setting this circuit part 430 generates different currents through the mixer core, which mixer core is the fourth encircled part 440. The function of the mixer core 440 is to mix the IF current with a LO frequency in order to generate the differential RF signals. The mixer circuit 400 has the dual purpose of power amplification and mixing, and the variable current block 430 and the variable resistor block 420 provides a power amplification function. By means of the variable current block 430 the switching current can be reduced, and such programmable power gain reduces the current consumption when the mixer circuit 400 is not used in maximum output power mode.

The fifth and sixth encircled parts 450, 460 include bias transistors. The shown four transistors $P_1, P_2, P_3, P_4$ at the top of the figure are transistors generating appropriate bias currents to the mixer circuit 400. However, it is understood that any suitable number of transistors can be utilised. The bias transistor block 450, 460 supply the V/I conversion block 410, the variable current block 430, the mixer core 440 and a LO buffer (not shown) with currents and voltages. The transistors $N_1, N_2, N_3$ in the bottom of the figure, encircled at 460, are arranged to copy the generated IF currents to the right part of the mixer circuit 400.

As is indicated in FIG. 4, the new design of the mixer circuit 400 is divided into two parts: encircled parts 410, 420, 450, 460 and 430, 440, respectively. All the components included and used for mixing and amplification require more or less headroom in order to work satisfactory. That is, the required margin of safety (usually expressed in decibels) between nominal operating levels and a signal-overload condition. A low voltage supply of usually a few volts, such as 2-3 V, which is a usual range for portable devices such as cellular phones, is not enough headroom for having both V/I conversion and mixer core stacked together. Therefore the mixer core 440 and the variable current block 430 are designed in a part separated from the V/I conversion at the left part of the figure to make use of 2 V power supply individually. The design of the mixer circuit in accordance with one implementation thus differs from the known Gilbert mixer in this regard. The blocks 410, 420, 450, 460 and blocks 430, 440 are separated in the design, but it should be understood that the components are still integrated onto a single integrated circuit.

FIG. 5 shows an embodiment of the variable current block 430 in accordance with an implementation. Transistors $M_{100}$, $M_{101}, M_{102}, \ldots, M_n$ and switches $S_0, S_1, S_2, \ldots, S_n$ enable the provision of variable current; depending on how many switches $S_0, S_1, S_2, \ldots, S_n$ that are set the current consumption can be varied accordingly. The variable current block 430 is thus operative to supply a variable quantity of auxiliary current to the input of the mixer core 420, thereby functioning as a power amplifier. By means of this innovative design of a mixer circuit including amplification within the mixer circuit, separate power amplifiers are not needed after the mixing stage, and the signal can be conveyed to the antenna directly. In accordance with an implementation, it is thus possible to eliminate power amplifier stages usually required after a mixing stage, whereby a reduced chip area requirement is accomplished, and whereby the number of required components and thus the current consumption can be reduced. Exemplary values are indicated in the figure: the total current $I_{tot}$ could for example be up to 10 mA. However, it is understood that other values could be accomplished in the same way. The currents could for example be equally large or have any desired value. That is, having all switches switched on, gives the maximum output current and any variation down to the single branch consisting of a single switch transistor $S_i$ and a single transistor $M_i$ is possible.

It should be understood that since the switches and transistors are connected in series, they could switch places in the drawing, still fulfilling their purpose. The transistors $M_{100}$, $M_{101}, M_{102}, \ldots, M_n$ and switches $S_0, S_1, S_2, \ldots, S_n$ can be implemented as CMOS transistors or bipolar transistors.

Simulations were performed for an implementation of the mixer circuit 400 and showed that the current consumption was reduced by approximately 10% compared to an existing comparable circuit. Further, the reduction in current consumption was achieved without compromises in other performance parameters, such as linearity, conversion gain, noise etc., i.e. the other performance parameters or requirements were comparable for the two circuits.

The power mixer circuit 400 in accordance with one implementation may be implemented by means of NMOS and PMOS transistors of regular and analogue type. The mixer circuit in accordance with this implementation may be designed by means of 0.13 μm CMOS technology.

Figure 6:
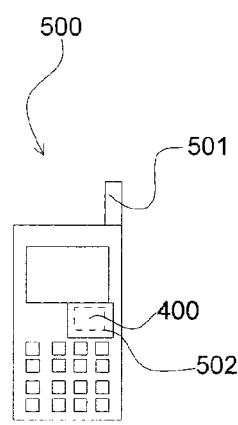
FIG. 6 illustrates an exemplary application of a mixer.

The mixer circuit 400 can be utilised in a RF transmitter 502 for use in, for example, a cellular phone 500, as shown in FIG. 6. The modulator of the transmitter 502 comprises a mixer circuit 400, the modulator performing conventional steps in order to transmit data, that is, accepting incoming digital data; grouping the data into symbols; using these symbols to set or change the phase, frequency or amplitude of the reference signal appropriately; and passing the modulated signal on for further processing, such as filtering and channel-coding, before transmission. The transmitter 502 further comprises conventional components, for example in order to perform filtering and channel coding etc. However, a separate power amplification stage can be eliminated when using the mixer circuit 400 and the output from the mixer stage can be provided to the antenna 501 without an intermediate power amplification stage.

In summary, implementations have been described that provide an innovative mixer circuit also performing power amplification and no extra driver is needed at the output; the modulated signal can be output directly to an antenna without an intermediate power amplification stage. The current consumption can thereby be reduced considerably and the circuit requires less chip area. The use of digital programmable power gain can also reduce the current consumption, since unnecessarily large power can be avoided, that is, an appropriate current can be used when the mixer is not used in maximum output power mode.

CONCLUSION

For the purposes of this disclosure and the claims that follow, the terms "coupled" and "connected" may have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The invention claimed is:

1. A mixer circuit comprising a mixer core for mixing an input frequency signal with a local oscillator signal, the input frequency signal comprising one or more input intermediate frequency signals:
   a variable current block arranged to feed the mixer core with an amplified input signal, said variable current block arranged between an input for receiving the input frequency signal and the mixer core, said variable current block comprising transistors and switches to enable provision of a variable current; and
   a voltage-to-current conversion block comprising transistors for performing a voltage-to-current conversion, said voltage to current conversion block receiving the one or more input intermediate frequency signals, converting a difference in a voltage of said one or more input intermediate frequency signals to a difference in current and outputting to said variable current block the corresponding difference in current, wherein the local oscillator signal comprises a modulated signal generated by a digital phase locked loop circuit and modulated by phase information.

2. A mixer circuit comprising a mixer core for mixing an input frequency signal with a local oscillator signal, the mixer circuit comprising:
- a variable current block arranged to feed the mixer core with an amplified input signal, said variable current block arranged between an input for receiving the input frequency signal and the mixer core, said variable current block comprising transistors and switches to enable provision of a variable current,
- wherein said voltage to current conversion block further comprises a variable resistor ($R_v$) arranged between said transistors, for fine-tuning said variable current.

3. The mixer circuit as claimed in claim 2, wherein said fine-tuning is performed in 1 dB steps.

4. The mixer circuit as claimed in claim 2, wherein said voltage to current conversion block comprises a fixed resistor arranged between said transistors.

5. The mixer circuit as claimed in claim 4, wherein the mixer circuit further comprises biasing transistor blocks generating bias currents to said variable current block, to said mixer core and to said voltage to current conversion block.

6. The mixer circuit as claimed in claim 5, wherein the voltage to current conversion block and the biasing transistor blocks and the variable current block and the mixer core, respectively, are arranged to be fed individually.

7. A mixer circuit comprising:
- a mixer core for mixing an input frequency signal with a local oscillator signal;
- a variable current block arranged to feed the mixer core with an amplified input signal, said variable current block arranged between an input for receiving the input frequency signal and the mixer core, said variable current block comprising transistors and switches to enable provision of a variable current,
- wherein a respective one of the transistors of said variable current block are connected, via a source/drain terminal thereof, in series with a respective one of said switches.

8. A radio frequency transmitter comprising a mixer circuit having a mixer core for mixing an input frequency signal with a local oscillator signal, the mixer circuit comprising:
- a variable current block arranged to feed the mixer core with an amplified input signal, said variable current block arranged between an input for receiving the input frequency signal and the mixer core, and comprising transistors and switches for enabling provision of a variable current,
- wherein the mixer circuit further comprises a voltage to current conversion block comprising transistors for performing a voltage to current conversion, and
- wherein said voltage to current conversion block further comprises a variable resistor ($R_v$) arranged between said transistors, for fine tuning said variable current.

9. A radio frequency transmitter comprising a mixer circuit having a mixer core for mixing an input frequency signal with a local oscillator signal, the mixer circuit comprising:
- a variable current block arranged to feed the mixer core with an amplified input signal, said variable current block arranged between an input for receiving the input frequency signal and the mixer core, and comprising transistors and switches for enabling provision of a variable current,
- wherein signal output from said mixer circuit is fed directly to an antenna, a signal path between said mixer circuit and the antenna including no amplifiers.

10. A radio frequency transmitter comprising a mixer circuit having a mixer core for mixing an input frequency signal with a local oscillator signal, the mixer circuit comprising:
- a variable current block arranged to feed the mixer core with an amplified input signal, said variable current block arranged between an input for receiving the input frequency signal and the mixer core, and comprising transistors and switches for enabling provision of a variable current,
- wherein the mixer circuit further comprises a voltage to current conversion block comprising transistors for performing a voltage to current conversion, and
- wherein said voltage to current conversion block comprises a fixed resistor arranged between said transistors.

11. The transmitter as claimed in claim 10, wherein the mixer circuit further comprises biasing transistor blocks generating bias currents to said variable current block, said mixer core and said voltage to current conversion block.

12. The transmitter as claimed in claim 11, wherein the voltage to current conversion block and the biasing transistor blocks and the variable current block and the mixer core, respectively, are arranged to be fed individually.

13. The transmitter as claimed in claim 8, wherein a respective one of the transistors of said variable current block are connected in series with a respective one of said switches.

14. A mixer circuit comprising a mixer core for mixing an input frequency signal with a local oscillator signal, the input frequency signal comprising one or more input intermediate frequency signals:
- a variable current block arranged to feed the mixer core with an amplified input signal, said variable current block arranged between an input for receiving the input frequency signal and the mixer core, said variable current block comprising transistors and switches to enable provision of a variable current,
- wherein the local oscillator signal comprises a modulated signal generated by a digital phase locked loop circuit and modulated by phase information.

\* \* \* \* \*